United States Patent
Fu et al.

(10) Patent No.: US 8,772,854 B2
(45) Date of Patent: Jul. 8, 2014

(54) MULTIPLE-TIME PROGRAMMING MEMORY CELLS AND METHODS FOR FORMING THE SAME

(75) Inventors: Ching-Hung Fu, Hsin-Chu (TW);
Chun-Yao Ko, Hsin-Chu (TW);
Tuo-Hsin Chien, Zhubei (TW);
Ting-Chen Hsu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 53 days.

(21) Appl. No.: 13/437,503

(22) Filed: Apr. 2, 2012

(65) Prior Publication Data
US 2013/0256772 A1      Oct. 3, 2013

(51) Int. Cl.
*H01L 29/788* (2006.01)
*H01L 29/76* (2006.01)
*H01L 21/336* (2006.01)

(52) U.S. Cl.
USPC ............................ 257/315; 257/316; 438/257

(58) Field of Classification Search
USPC ......... 257/313–319, 311, 326, 296, 321, 304, 257/202, 365–366, 346, 382, 387, 390, 298, 257/300, E29.3, E21.409; 365/185.08, 365/185.26, 185.29, 185.1
See application file for complete search history.

(56) References Cited

U.S. PATENT DOCUMENTS

| | | | |
|---|---|---|---|
| 6,172,392 B1 * | 1/2001 | Schmidt et al. | 257/315 |
| 6,700,154 B1 * | 3/2004 | Vidmantas et al. | 257/316 |
| 2009/0001445 A1 * | 1/2009 | Park | 257/316 |

* cited by examiner

*Primary Examiner* — Steven Loke
*Assistant Examiner* — Mouloucoulaye Inoussa
(74) *Attorney, Agent, or Firm* — Slater and Matsil, L.L.P.

(57) ABSTRACT

A device includes an active region and a coupling capacitor. The capacitor includes a first floating gate as an upper capacitor plate of the coupling capacitor, and a doped semiconductor region as a lower capacitor plate of the coupling capacitor. The doped semiconductor region includes a surface portion at a surface of the active region, and a sidewall portion lower than a bottom surface of the surface portion. The sidewall portion is on a sidewall of the active region. A capacitor insulator is disposed between the upper capacitor plate and the lower capacitor plate. The capacitor insulator includes an upper portion, and a sidewall portion lower than a bottom surface of the upper portion.

14 Claims, 9 Drawing Sheets

MULTIPLE-TIME PROGRAMMING MEMORY CELLS AND METHODS FOR FORMING THE SAME

BACKGROUND

Multiple-Time Programming (MTP) memory cells retain the information stored in the memory cells even when the power is turned off. Typically, to form the MTP memory cells, a standard Complementary Metal-Oxide-Semiconductor (CMOS)-based logic process is used as a starting foundation. Additional process steps may be incorporated into the logic process flow to form the MTP memory cells. Examples of such additional process steps include second polysilicon deposition, junction dopant optimization, etc. MTP memory cells typically require large capacitors in order to improve the efficiency in the programming of the MTP memory cells. Accordingly, the chip areas occupied by the MTP memory cells are large.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Multiple-Time Programming (MTP) memory cell and the methods of forming the same are provided in accordance with various exemplary embodiments. The intermediate stages of forming the MTP memory cell are illustrated. The variations of the embodiments are discussed. Throughout the various views and illustrative embodiments, like reference numbers are used to designate like elements.

Figure 1:
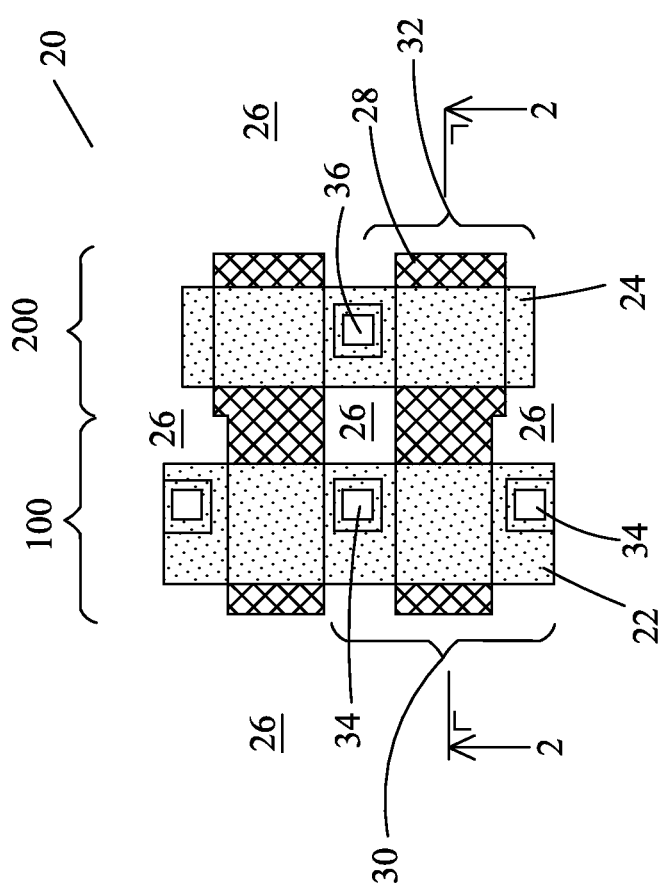
FIG. 1 illustrates a layout of a portion of a Multiple-Time Programming (MTP) memory cell.

FIG. 1 illustrates a layout of a portion of MTP memory cell 20. The illustrated portion includes active regions 22 and 24. Active regions 22 and 24 are parts of semiconductor regions isolated from each other by isolation region(s) 26. In accordance with some embodiments, active regions 22 and 24 are formed of crystalline silicon. In other embodiments, active regions 22 and 24 are formed of other semiconductor materials such as silicon germanium, silicon carbon, or the like. Isolation regions 26 may be Shallow Trench Isolation (STI) regions, and hence are referred to as STI regions 26 hereinafter. Floating gate 28 extends over active regions 22 and 24 and STI regions 26, and is electrically floating.

Figure 7:
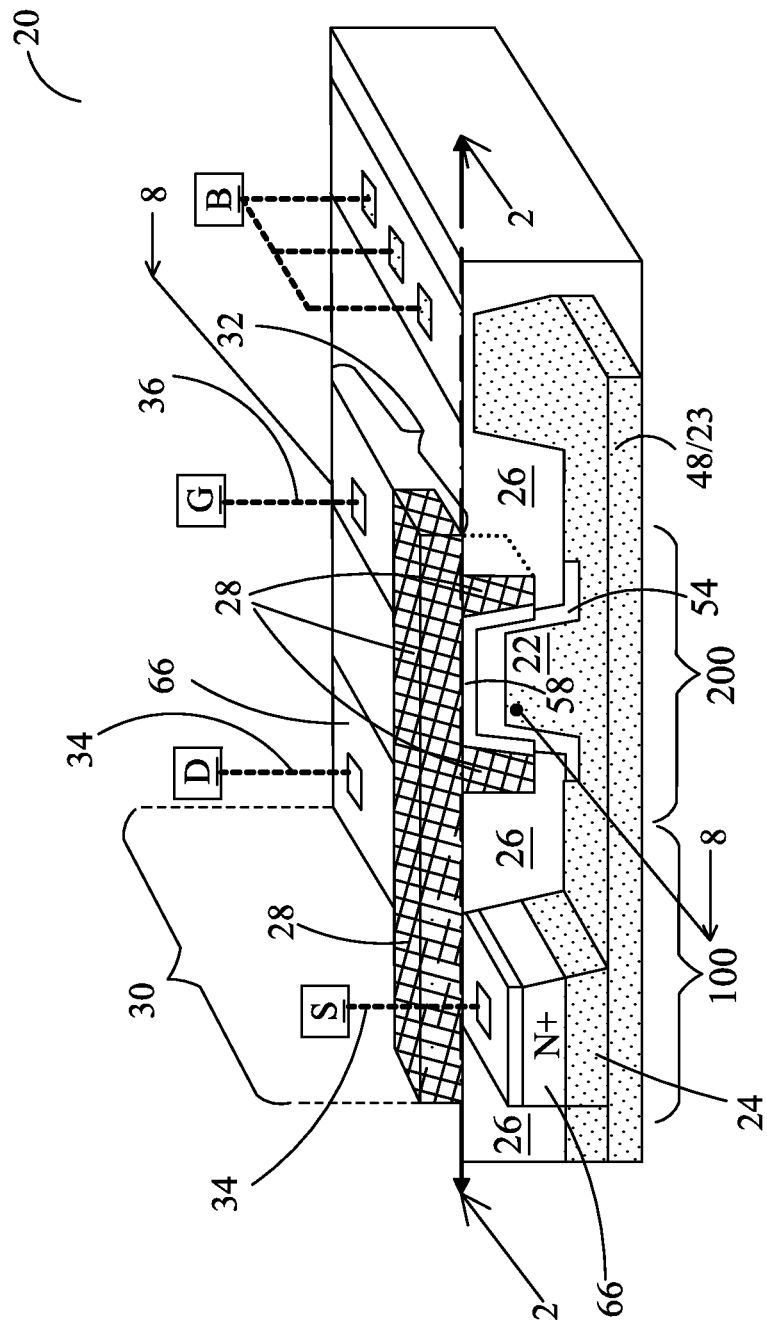
FIGS. 7 and 8 illustrate a perspective view and a schematic cross-sectional view, respectively, of the portion of the MTP memory cell.

A first portion (also referred to as the first floating gate hereinafter) of floating gate 28 and active region 22 form transistor 30, wherein active region 22, when doped, forms the source and drain regions of transistor 30. Transistor 30 may be the erase transistor of MTP memory cell 20 in some exemplary embodiments. It is appreciated that MTP memory cell 20 may also include additional transistors, capacitors, and the like (as illustrated in exemplary FIG. 9). A second portion (also referred to as the second floating gate hereinafter) of floating gate 28 and active region 24 form coupling capacitor 32, wherein the second portion of floating gate 28 forms the upper capacitor plate of coupling capacitor 32, and doped active region 24 forms the lower capacitor plate. Contact plugs 34 may be formed to connect to the source and drain regions of transistor 30. Contact plug 36 is formed to connect to the lower capacitor plate that is formed in active region 24. Throughout the description, the region in which transistor 30 is to be formed is referred to as transistor region 100, and the region in which coupling capacitor 32 is to be formed is referred to as capacitor region 200. A perspective view of transistor 30 and coupling capacitor 32 is illustrated in FIG. 7.

Figure 2:
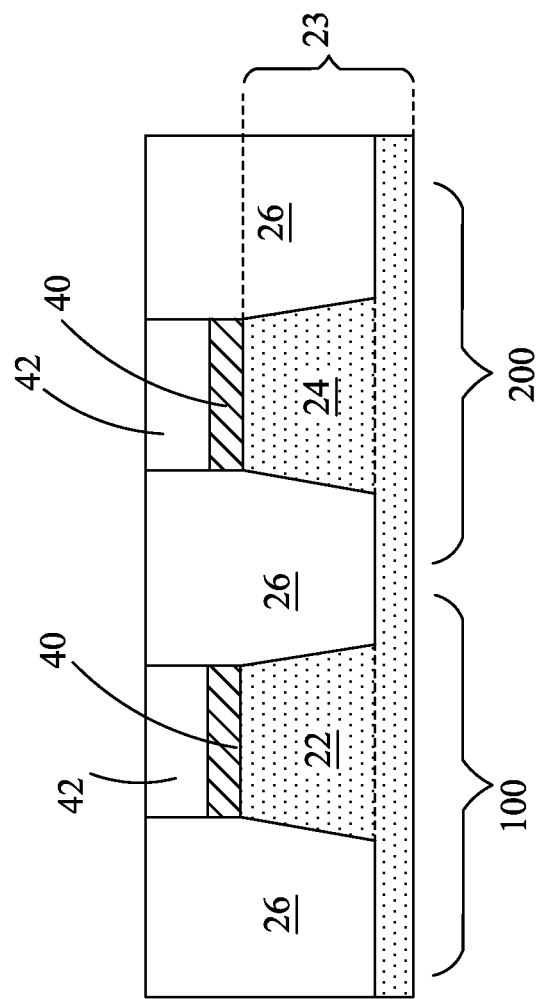
FIGS. 2 through 6 are cross-sectional views of intermediate stages in the manufacturing of a MTP memory cell in accordance with some exemplary embodiments.
Figure 4:
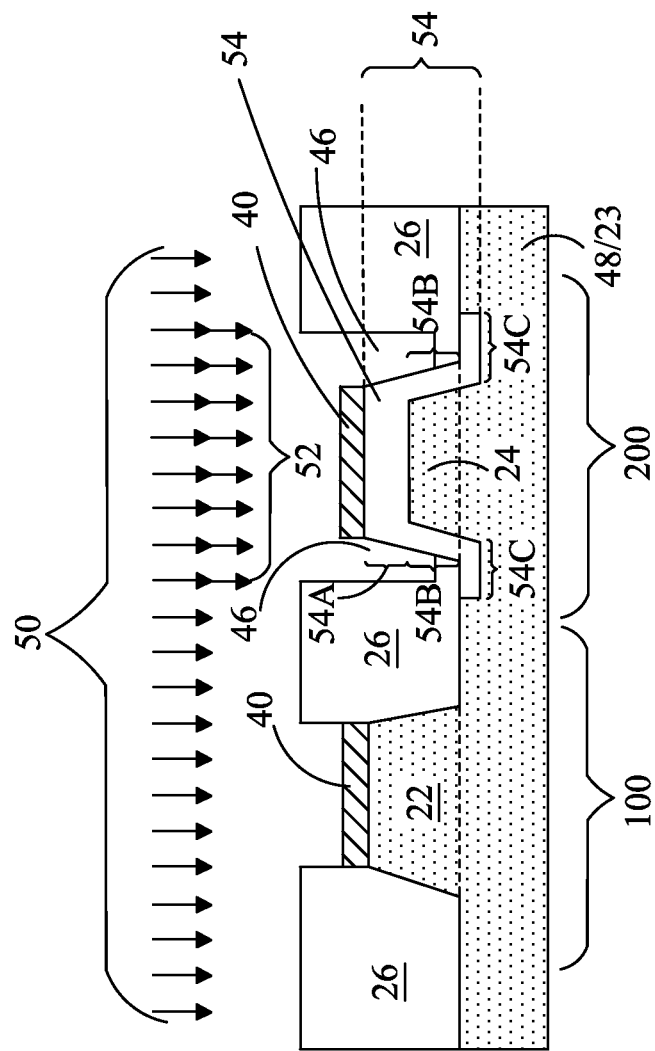
Figure 5:
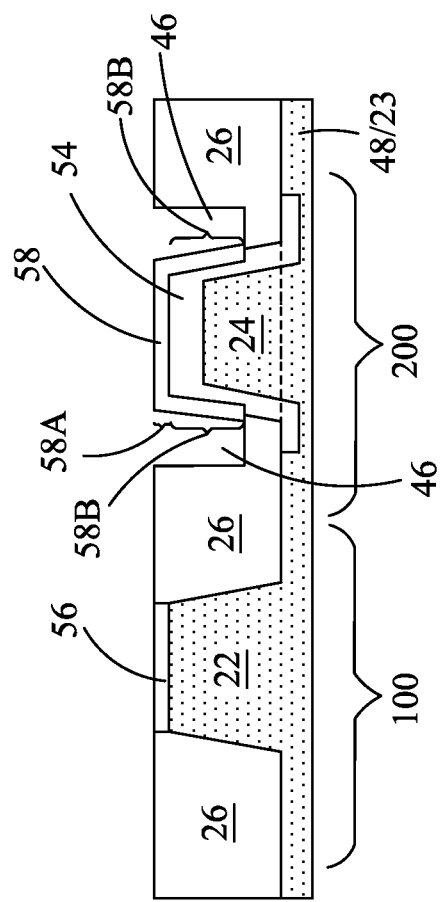
Figure 6:
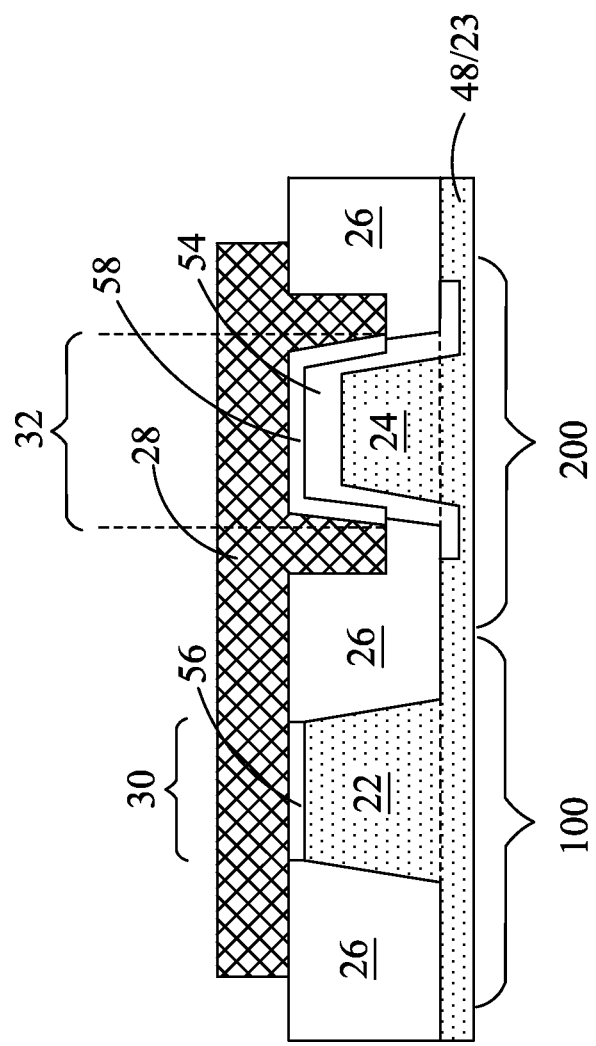

FIGS. 2 through 6 illustrate cross-sectional views of intermediate stages in the manufacturing of the portion of MTP memory cell 20 in accordance with some exemplary embodiments. The cross-sectional views in FIGS. 2 and 6 are obtained from the plane crossing line 2-2 in FIGS. 1 and 7. Referring to FIG. 2, an initial structure is formed, which includes STI regions 26 and active regions 22 and 24. Active regions 22 and 24 may be parts of original substrate 23, which may be a silicon substrate, although other semiconductor materials may be used. The formation of STI regions 26 includes forming and patterning pad oxide layers 40 and hard mask layers 42, and etching portions of substrate 23 that are not covered by the patterned pad oxide layers 40 and hard mask layers 42 to form recesses. The recesses are then filled with dielectric materials to form STI regions 26. After the filling of the dielectric materials, excess portions of the dielectric materials over the surfaces of hard mask layers 42 are removed, for example, in a Chemical Mechanical Polish (CMP) process. Hard mask layers 42, which may comprise silicon nitride, may be used as the CMP stop layers. The resulting structure is shown in FIG. 2.

Figure 3:
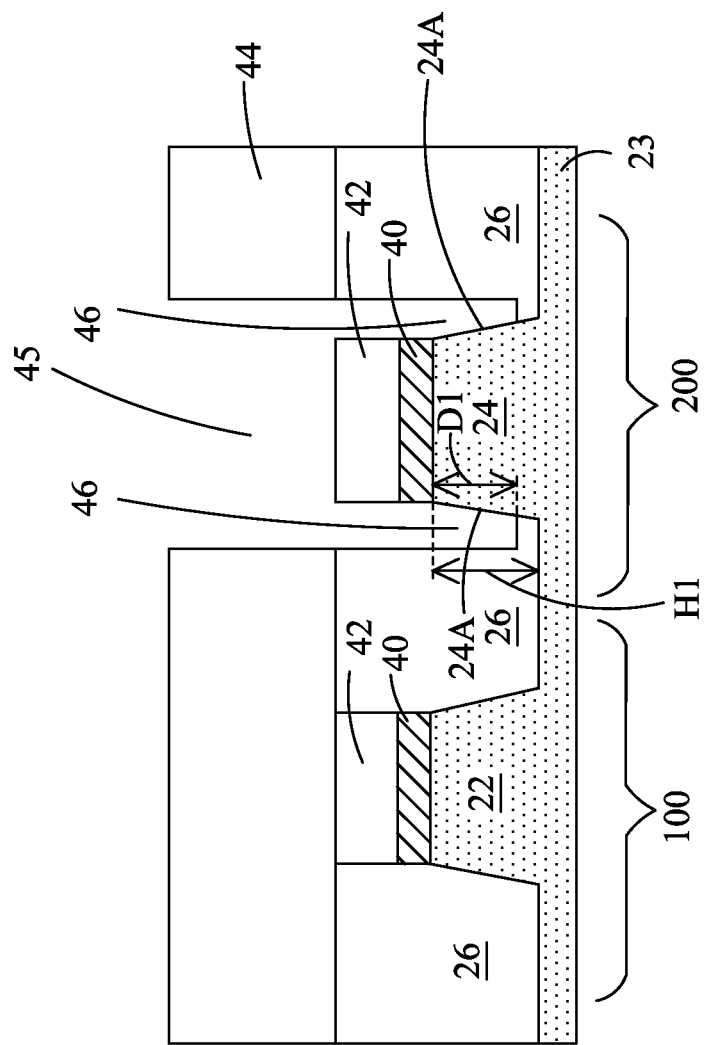

Next, referring to FIG. 3, photo resist 44 is formed to cover the features in transistor region 100. Portions of hard mask layer 42 and some portions of STI regions 26 in capacitor region 200 are exposed through opening 45 in photo resist 44, and the rest of the portions may be covered. Next, the exposed portions of STI regions 26 are etched to form recesses 46 in STI regions 26. Sidewalls 24A of active region 24 are exposed to recesses 46. In some embodiments, depth D1 of recesses 46 is smaller than height H1 of active region 24. Depth D1 may also be between about 30 percent and about 85 percent height H1. During the etching of STI regions 26, the portions of STI regions 26 in transistor region 100 are not etched. After the etching of STI regions 26, photo resist 44 is removed.

Hard mask layers 42 are then removed, and the resulting structure is shown in FIG. 4. A p-type implantation is performed to dope active regions 22 and 24 and portion of substrate 23. As a result of the implantation, p-well region 48 is formed in substrate 23. Active regions 22 and 24 are parts of the p-well region 48. The p-type implantation is symbolized by arrows 50. The implantation may include a plurality of implantations performed with different energy levels, so that the resulting p-well region 48 may extend from the top surface of active regions 22 and 24 to a level lower than the bottom surfaces of STI regions 26. In addition, an n-type implantation (symbolized by arrows 52) is performed to dope the features in capacitor region 200. During the n-type implantation, transistor region 100 is masked by a mask such as a photo resist (not shown), and hence is not implanted.

The energy for the n-type implantation may be lower than the p-type implantation, so that a surface layer of active region 24, including the top surface layer and side surface layers of active region 24, is doped to form n-type region 54. The inner and lower portions of active region 24 and substrate 23 are not implanted, and thus remain to be of p-type. The resulting n-type region 54 is surrounded by p-well region 48, and the bottom surfaces of n-type region 54 are in contact with p-well region 48. In some embodiments, n-type region 54 may further extends into p-well region 48 and overlaps a portion of STI regions 26. As shown in FIG. 4, n-type region 54 includes top surface portion 54A that is over the top surface of active region 24, sidewall portions 54B that are on the sidewalls of active region 24, and lower portions 54C that are in p-well region 48 and under portions of STI regions 26. Portions 54C are also underlying recesses 46. Sidewall portions 54B are further lower than the bottom surface of surface portion 54A. In alternative embodiments wherein the portions of STI regions 26 under recesses 46 are thick enough, lower portions 54C may not be formed.

Next, pad oxide layers 40 are removed, and the resulting structure is shown in FIG. 5. An oxidation may be performed to oxidize a surface layer of each of active regions 22 and 24, so that gate oxide 56 and capacitor insulator 58 are formed in transistor region 100 and capacitor region 200, respectively. The upper portion of n-type region 54 is oxidized, and the lower portion of n-type region 54 is not oxidized. Accordingly, the bottom surface of capacitor insulator 58 is in contact with the top surfaces of the remaining lower portions of n-type region 54. Capacitor insulator 58 also includes top surface portion 58A and sidewall portions 58B, wherein sidewall portions 58B is lower than the bottom surface of top surface portion 58A.

In FIG. 6, a conductive material is formed and patterned to form floating gate 28. Floating gate 28 extends into transistor region 100 to form the gate electrode of the resulting transistor 30 (FIG. 1). In some embodiments, floating gate 28 comprises polysilicon, although other conductive materials may be used. Floating gate 28 extends into capacitor region 200 to form the upper capacitor plate of the resulting coupling capacitor 32 (please also refer to FIG. 1). Furthermore, floating gate 28 comprises portions extending into recesses 46 (FIG. 4), which portions are lower than the top surfaces of STI regions 26, and lower than the top surfaces of active regions 22 and 24.

Figure 8:
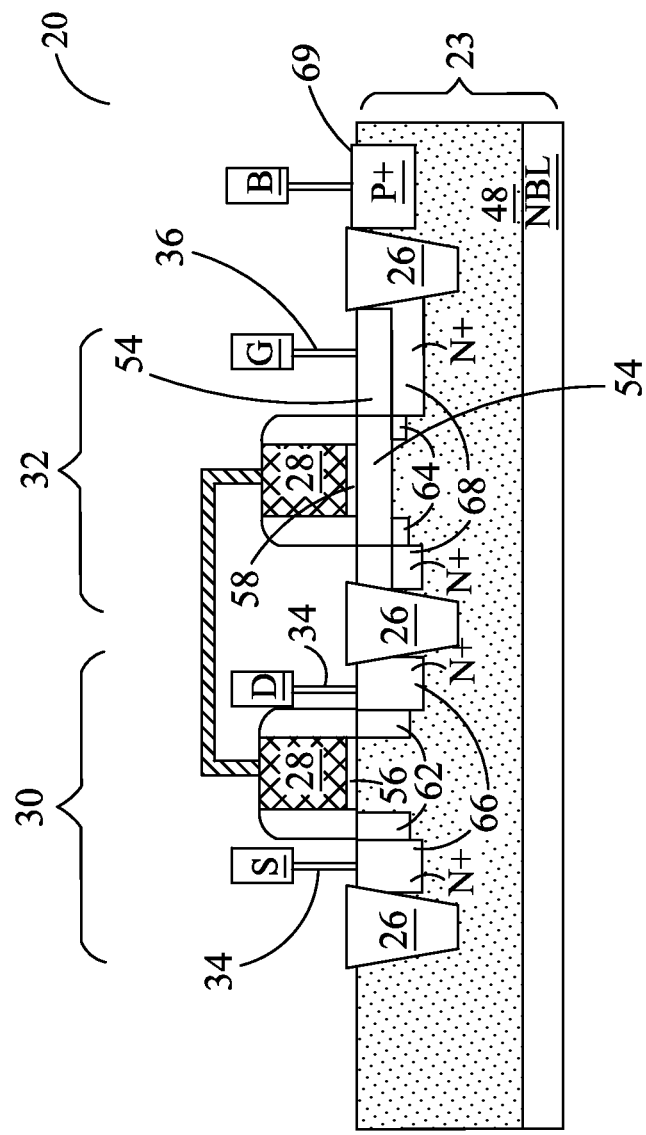

In subsequent steps, the remaining components of transistor 30 and coupling capacitor 32 are formed, which components are schematically illustrated in FIG. 8. The corresponding perspective view is shown in FIG. 7. FIG. 8 is obtained from the plane crossing line 8-8 in FIG. 7. It is appreciated that in FIG. 8, transistor 30 and pickup region "B" are illustrated in the same plane as coupling capacitor 32, although they are actually not in the same plane in FIG. 7. As shown in FIG. 8, a Lightly-Doped Drain/source (LDD) implantation is performed to form LDD regions 62 and 64, wherein LDD regions 62 and 64 are of n-type, and extend under floating gate 28. A further implantation is performed to form heavily doped source region (which node is denoted as "S") and drain region (which node is denoted as "D") 66 for transistor 30 and heavily doped regions 68 for coupling capacitor 32. Contact plugs 34 and 36 are formed to connect to source/drain regions 66 of transistor 30 and heavily doped regions 68 of coupling capacitor 32, respectively.

In the resulting coupling capacitor 32, heavily doped region 68, LDD regions 64, and n-type region 54 form the lower capacitor plate of coupling capacitor 32. The lower capacitor plate may be accessed through contact plug 36, which is marked as node "G," indicating that it may act as the programming gate of the respective MTP memory cell 20. Floating gate 28 forms the upper capacitor plate of coupling capacitor 32. Capacitor insulator 58 separates the lower capacitor plate from the upper capacitor plate. Bulk contact, which is marked as "B," is used to electrically connect to pickup region 69 of p-well region 48.

As shown in FIG. 5, since n-type region 54 includes a top portion and sidewall portions, the area of coupling capacitor 32, and hence the capacitance of coupling capacitor 32 is increased without requiring the increase in the occupied chip area.

Although the embodiments in FIGS. 2 through 6 provide methods of forming an n-type transistor and a capacitor that has an n-type lower capacitor plate, one skilled in the art will realize that the teaching of the embodiments is readily available for the formation of a p-type transistor and a capacitor that has a p-type lower capacitor plate, with the conductivity types of the respective well regions, LDD regions, heavily doped region, and/or the like, inverted.

Figure 9:
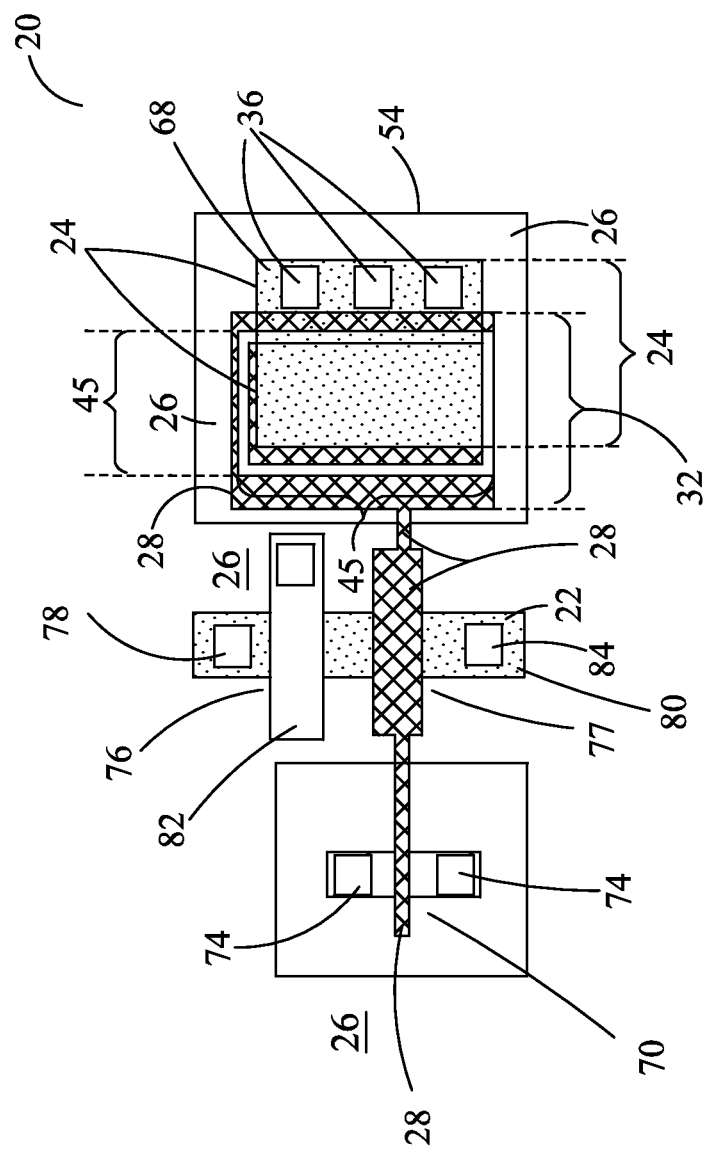
FIG. 9 illustrates a layout of a MTP memory cell in accordance with alternative embodiments.

FIG. 9 illustrates an MTP memory cell 20 in accordance with alternative embodiments. MTP memory cell 20 includes erase transistor (or capacitor) 70, which is controlled through erase gate 74. MTP memory cell 20 further includes select transistor 76, which is coupled to bit-line 78. Active region 80, which is in a p-well region, forms select transistor 76 and coupling capacitor 77 with gate electrode 82 and floating gate 28, respectively. Contact plug 84 may be coupled to a source line. Active region 24 forms a large region, wherein floating gate 28 overlaps a left portion of active region 24 to form coupling capacitor 32. The right portion of active region 24 is used for forming heavily doped region 68 and contact plugs 36. Rectangle 45 is the region in which STI regions 26 are etched, wherein rectangle 45 correspond to opening 45 of photo resist 44 in FIG. 3. N-type region 54 is also marked to indicate the boundaries of the chip area receiving the n-type implantation. The formation details of capacitor 32 may be found through the embodiments shown in FIGS. 2 through 6, and are not repeated herein.

In FIG. 9, the recesses (which corresponds to recesses 46 in FIG. 3) in STI region 26 are formed on three sides (including the left side, the upper side, and the lower side) of active region 24. Accordingly, the lower capacitor plate of coupling capacitor 32 includes three sidewalls of active region 24. The capacitance of coupling capacitor 32 is thus significantly increased without increasing the chip area of active region 24.

In the programming, the erasing, and the reading of MTP cell 20 as shown in FIGS. 7, 8, and 9, different voltages are coupled to floating gate 28. Since floating gate is electrically floating, in FIG. 8, the voltage of floating gate 28 is affected by the plurality of voltages such as the voltages of nodes "S," "D," and "G." In FIG. 9, the voltage of floating gate 28 is affected by the plurality of voltages such as the voltages of features 74, 84, and 36. The details of the erasing, programming, and reading of MTP cell 20 are not discussed herein.

In the embodiments, by using the sidewalls of the active regions (in addition to the top surface of the active regions) to form the coupling capacitors, the capacitance values of the coupling capacitors may be significantly increased. The chip areas of the MTP memory cells, however, are not increased.

In accordance with embodiments, a device includes an active region and a coupling capacitor. The capacitor includes a first floating gate as an upper capacitor plate of the coupling capacitor, and a doped semiconductor region as a lower capacitor plate of the coupling capacitor. The doped semiconductor region includes a surface portion at a surface of the active region, and a sidewall portion lower than a bottom surface of the surface portion. The sidewall portion is on a sidewall of the active region. A capacitor insulator is disposed between the upper capacitor plate and the lower capacitor plate. The capacitor insulator includes an upper portion, and a sidewall portion lower than a bottom surface of the upper portion.

In accordance with other embodiments, an MTP memory cell includes a first active region and a second active region, a transistor, and a coupling capacitor. Portions of the first active region form a source region and a drain region of the transistor. A first floating gate acts as a gate electrode of the transistor. The coupling capacitor includes a second floating gate as an upper capacitor plate, wherein the second floating gate is electrically coupled to the first floating gate. The second floating gate includes a first portion over a top surface of the second active region, and a second portion lower than the top surface of the second active region. A capacitor insulator is disposed between the second floating gate and the second active region. The coupling capacitor further includes a lower capacitor plate including a top surface layer and a side surface layer of the second active region. The top surface layer and the side surface layer of the second active region are doped to have a same conductivity type.

In accordance with yet other embodiments, a method includes forming STI regions to separate a first active and a second active region of a semiconductor substrate from each other, and etching a portion of the STI regions to form a recess. The etched portion of the STI regions contacts a sidewall of the second active region. A top surface layer and a side surface layer of the second active region are implanted to form an implantation region, wherein the side surface layer of the second active region extends from the sidewall of the second active region into the second active region. An upper portion of the top surface layer and an upper portion of the side surface layer are oxidized to form a capacitor insulator. A floating gate is formed to extend over the first active region and the second active region, wherein the floating gate includes a portion extending into the recess.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a first active region comprising a well region of a first conductivity type;
    a Shallow Trench Isolation (STI) region adjacent to the first active region; and
    a coupling capacitor comprising:
        a first floating gate as an upper capacitor plate of the coupling capacitor;
        a doped semiconductor region as a lower capacitor plate of the coupling capacitor, wherein the doped semiconductor region is of a second conductivity type opposite to the first conductivity type, and wherein the doped semiconductor region comprises:
            a top portion at a top surface of the first active region, wherein the top portion comprises a bottom surface contacting a top surface of the well region;
            a bottom portion comprising a top surface contacting a bottom surface of the STI region; and
            a sidewall portion connecting the top portion to the bottom portion, wherein the sidewall portion is in contact with a sidewall of the well region; and
        a capacitor insulator between the upper capacitor plate and the lower capacitor plate, wherein the capacitor insulator comprises an upper portion, and a sidewall portion lower than a bottom surface of the upper portion.

2. The device of claim 1, wherein the STI region comprises a first top surface and a second top surface lower than the first top surface, and wherein the first floating gate comprises:
    a first portion over and contacting the first top surface of the STI region; and
    a second portion having a bottom surface contacting the second top surface of the STI region.

3. The device of claim 2, wherein the second portion of the first floating gate comprises a sidewall contacting a sidewall of the STI region.

4. The device of claim 2, wherein the doped semiconductor region further extends underlying and aligned to a portion of the second portion of the first floating gate.

5. The device of claim 1 further comprising:
    a second active region; and
    a transistor comprising:
        a source region and a drain region formed of portions of the second active region; and
        a second floating gate as a gate electrode of the transistor, wherein the first floating gate and the second floating gate are continuous connected to each other, and wherein the coupling capacitor and the transistor are portions of a Multiple-Time Programming (MTP) memory cell.

6. A device comprising:
    a first active region and a second active region;
    a Shallow Trench Isolation (STI) region comprising:
        a first top surface;
        a second top surface lower than the first top surface; and
        a sidewall connecting the first top surface to the second top surface;
    a transistor, wherein portions of the first active region form a source region and a drain region of the transistor, and wherein a first floating gate acts as a gate electrode of the transistor; and
    a coupling capacitor comprising:
        a second floating gate as an upper capacitor plate, wherein the second floating gate is electrically coupled to the first floating gate, and wherein the second floating gate comprises:
            a first portion over a top surface of the second active region; and
            a second portion lower than the top surface of the second active region;
        a capacitor insulator between the second floating gate and the second active region; and a lower capacitor plate comprising a top surface layer, a bottom layer, and a side surface layer of the second active region, wherein the top surface layer, the bottom layer, and the side surface layer of the second active region are doped to have a same conductivity type, with the bottom layer comprising a portion overlapped by the STI region, wherein the transistor and the coupling capacitor are portions of a Multiple-Time Programming (MTP) memory cell.

7. The device of claim 6, wherein the capacitor insulator comprises an upper portion, and a sidewall portion lower than a bottom surface of the upper portion, and wherein the sidewall portion of the capacitor insulator is between, and in physical contact with the side surface layer of the second active region and the second portion of the second floating gate.

8. The device of claim 6, wherein the capacitor insulator comprises an oxide of the second active region.

9. The device of claim 6, wherein the first floating gate and the second floating gate are portions of a continuous floating region that is electrically floating.

10. The device of claim 6, wherein the second active region further comprises a heavily doped semiconductor region on a side of the second floating gate, wherein the heavily doped semiconductor region is of a same conductivity type as the top surface layer and the side surface layer of the second active region.

11. The device of claim 6, wherein the bottom layer comprises a top surface in contact with a bottom surface of the STI region.

12. A device comprising: a semiconductor substrate; Shallow Trench Isolation (STI) regions extending into the semiconductor substrate, wherein portions of the semiconductor substrate between the STI regions form a first active region and a second active region; a well region of a first conductivity type extending into the first active region and the second active region; a transistor comprising: portions of the first active region forming a source region and a drain region of the transistor; and a first portion of a continuous conductive feature acting as a gate electrode of the transistor; and a coupling capacitor, wherein the coupling capacitor comprises: the second active region with surface portions acting as a lower capacitor plate of the coupling capacitor, wherein the lower capacitor plate is doped to a second conductivity type opposite to the first conductivity type, and wherein the lower capacitor plate extends underlying a bottom surface of one of the STI regions; an insulation region comprising a first portion overlying and contacting a top surface of the second active region, and second portions contacting opposite sidewalls of the second active region; and a second portion of the continuous conductive feature acting as an upper capacitor plate of the coupling capacitor, wherein the second portion of the continuous conductive feature contacts the second portions of the insulation region.

13. The device of claim 12, wherein the surface portions that are doped to the second conductivity type comprises a part overlapped by a portion of one of the STI regions.

14. The device of claim 12, wherein the second portion of the continuous conductive feature extends to lower than a top surface of the second active region.

\* \* \* \* \*